US010620299B2

(12) United States Patent  (10) Patent No.: US 10,620,299 B2
Adut  (45) Date of Patent: Apr. 14, 2020

(54) UNITY GAIN BUFFER WITH TWO STATES

(71) Applicant: LINEAR TECHNOLOGY CORPORATION, Milpitas, CA (US)

(72) Inventor: Joseph Adut, Palo Alto, CA (US)

(*) Notice: Subject to any disclaimer, the term of this patent is extended or adjusted under 35 U.S.C. 154(b) by 190 days.

(21) Appl. No.: 15/465,562

(22) Filed: Mar. 21, 2017

(65) Prior Publication Data

US 2018/0275250 A1   Sep. 27, 2018

(51) Int. Cl.
| | |
|---|---|
| *G01S 7/48* | (2006.01) |
| *G01S 7/481* | (2006.01) |
| *G01S 7/4914* | (2020.01) |
| *H03F 3/50* | (2006.01) |
| *G01S 7/4863* | (2020.01) |
| *H03F 3/45* | (2006.01) |
| *H03F 3/21* | (2006.01) |
| *G01S 17/06* | (2006.01) |

(52) U.S. Cl.
CPC .......... *G01S 7/4816* (2013.01); *G01S 7/4863* (2013.01); *G01S 7/4914* (2013.01); *G01S 17/06* (2013.01); *H03F 3/211* (2013.01); *H03F 3/4508* (2013.01); *H03F 3/45475* (2013.01); *H03F 3/50* (2013.01); *H03F 2203/45026* (2013.01); *H03F 2203/45288* (2013.01); *H03F 2203/45356* (2013.01)

(58) Field of Classification Search
CPC .......... B60W 30/08; B60T 7/22; B62D 15/02; G01S 17/02; G01S 17/93; G01S 7/481
See application file for complete search history.

(56) References Cited

U.S. PATENT DOCUMENTS

| | | | |
|---|---|---|---|
| 9,069,060 B1 | 6/2015 | Zbrozek et al. | |
| 9,299,731 B1 | 3/2016 | Lenius et al. | |
| 2013/0258157 A1* | 10/2013 | Nam | H04N 5/225 |
| | | | 348/311 |
| 2015/0258990 A1* | 9/2015 | Stettner | G01S 17/023 |
| | | | 701/37 |

FOREIGN PATENT DOCUMENTS

| | | |
|---|---|---|
| CN | 108627815 A | 10/2018 |
| JP | 2000180706 A | 6/2000 |
| JP | 2015007615 A | 1/2015 |

OTHER PUBLICATIONS

Widlar, Super-Gain Transistors for IC's, IEEE Journal of Solid State Circuits, Aug. 1969; pp. 249-251.
Analog Devices, 2.5Ω, 1.8 V to 5.5 V,±2.5 V Triple/Quad SPDT Switches in Chip Scale Packages, Rev. C, 2001-2015; pp. 1-11.
Widlar, The LM110 An Improved IC Voltage Follower; National Semiconductor Corporation, Linear Brief 11, Mar. 1970, pp. 1-4.
National Semiconductor, LM 110/LM201/LM201 Voltage Follower, Nov. 1994; pp. 1-16.
"Chinese Application Serial No. 201810233523.9, Voluntary Amendment Filed Jan. 17, 2019", w/ English Claims, 14 pgs.
"Japanese Application Serial No. 2018-052270, Notification of Reasons for Rejection dated Jul. 8, 2019", W/English Translation, 6 pgs.

\* cited by examiner

*Primary Examiner* — Luke D Ratcliffe
(74) *Attorney, Agent, or Firm* — Patent Capital Group

(57) ABSTRACT

A unity gain buffer provides an "ON" state in which the input signal is coupled to the output terminal and an "OFF" state in which the input signal is isolated from the output terminal. Multiple unity gain buffers may share the same load to form a voltage-mode maximum follower or a multiplexer.

26 Claims, 5 Drawing Sheets

UNITY GAIN BUFFER WITH TWO STATES

BACKGROUND OF THE INVENTION

1. Field of the Invention

The present invention relates to analog amplifiers. In particular, the present invention relates to analog amplifiers with that may be used for applications such as a voltage-mode maximum follower or a multiplexer.

2. Discussion of the Related Art

Until solid-state Light Detection and Ranging (LIDAR) systems without any moving mechanical parts become available, there is a need for a commercial off-the-shelf (COTS) receiver that addresses board, power and cost constraints in a multi-channel high-performance LIDAR receiver.

A high-definition multi-channel LIDAR system (e.g. a vehicle with an Advanced Driver Assistance System) uses multiple lasers and multiple photo-sensors, such as avalanche photo-diodes ("APDs"). In such a system, TIAs typically convert the optical energy from APDs to electrical energy. To reduce the board area, power dissipation, and bill of materials of a LIDAR receiver, each TIA may be multiplexed among a number of APDs. Such multiplexing is achieved using additional analog switches and gain blocks in the signal paths. FIG. 1(a) shows conventional TIA 100, which consists of a preamplifier 101 and single-ended output buffer 102, receiving an input signal through a 2:1 selector or multiplexer 103. Such a circuit configuration is disclosed, for example, in U.S. Pat. No. 9,299,731 to Lenius et al., entitled "Systems and Methods for Selectable Photodiode circuits," issued on Mar. 29, 2016. In that circuit configuration, the on-resistance of the switch and the increased capacitance at the input terminal of the TIA increase noise gain. Thus, such an approach compromises both the receiver's bandwidth and its dynamic range.

To improve noise performance, one approach would be to forego multiplexing the TIAs and place the switch at the output terminals of the TIAs, such as shown in FIG. 1(b). FIG. 1(b) shows switch 112 multiplexing the output signals of conventional TIAs 110 and 111. Switch 112 may be implemented by a switch formed in an integrated circuit, such as the voltage-mode single-pole double-throw (SPDT). However, such a switch limits bandwidth, and may require an additional power supply voltage, so as not to limit signal swing. Furthermore, such a switch has a slow transition time (e.g., 20 ns). To achieve a shorter transition time, current-mode switching may be used to achieve a switching time of under 5 ns and, with careful design, achieving sub-nanosecond switching time in a standard bipolar process is possible. Building a fast transitioning switch in voltage-mode is a challenge, even in silicon-on-insulator processes, which may be quite expensive.

One alternative implementation of switch 112 is a voltage-mode maximum follower circuit. FIG. 2(a) shows conventional voltage-mode maximum follower circuit 200, which includes multiple common-collector stages 201-1, 201-2, . . . , 201-N, each including a bipolar transistor (e.g., bipolar transistors 202-1, 202-2, . . . , 202-N). The emitter terminals of these bipolar transistors are connected to common current source 204 and their base terminals are each controlled by a respective one of the input signals on input terminals in1, in2, . . . , inN. The common-collector stages 201-1, 201-2, . . . , 201-N are emitter followers that share the same output terminal 203. Voltage-mode maximum follower circuit 200 may be used as an output multiplexer by maintaining the minimum voltage at the active input terminal to be higher than the maximum voltage at any of the inactive input terminals. In this manner, only the signal in the single active terminal is provided to common output terminal 203. The currents in the bipolar transistors with the inactive input terminals are substantially suppressed from the shared output terminal 203. The approach of FIG. 1(b) requires a dedicated TIA for each input signal channel, and therefore increases cost. An additional difficulty is that current, state-of-the-art COTS TIAs cannot be directly incorporated into this approach.

For example, a conventional COTS TIA provides a single-ended output signal, often from the output stage of a unity gain buffer, such as the LM110 integrated circuit from National Semiconductor. (Discussions of the LM110 may be found, for example, in the data sheet LM110/LM210/LM310 Voltage Follower, National Semiconductor, November 1994 and the article Super-gain Transistors for IC's, R. J. Widlar, published in the IEEE Journal of Solid-State Circuits, 4(4):249-251, August 1969.) FIG. 2(b) shows conventional unity gain buffer 250, which is implemented, for example, in the LM110 integrated circuit. In unity gain buffer 250, the voltage feedback from output terminal 253 enhances the isolation and linearity of basic emitter follower with voltage feedback.

However, the conventional unity gain buffer (e.g., unity gain buffer 250) cannot be used as the common-collector stage of a voltage-mode maximum follower circuit (e.g., voltage-mode maximum follower circuit 200, discussed above) or in an output multiplexer circuit in which two or more buffers share the same output load. To illustrate, FIG. 3(a) illustrates one unsuccessful attempt to build a voltage-mode maximum follower 300 using unity gain buffers 301 and 302 sharing output node 303. In FIG. 3(a), voltage feedback amplifier A01 of unity gain buffer 301 drives the voltage at the emitter terminal of transistor Q01 to follow input signal in1, while voltage feedback amplifier A02 of unity gain buffer 302 drives the voltage at the emitter terminal of transistor Q02 to follow input signal in2. Thus, circuit 300 reveals an indefinite signal contention.

Accordingly, a unity gain buffer-based voltage-mode maximum follower circuit is desired that allows input terminals with higher voltages drive an output node, while isolating other input terminals with lower input voltages from the same output node.

SUMMARY

According to one embodiment of the present invention, a 2-state unity gain buffer provides an "ON" state in which the input signal is coupled to the output terminal and an "OFF" state in which the input signal is isolated from the output terminal. Multiple such unity gain buffers may share the same load to form a voltage-mode maximum follower or a multiplexer.

According to one embodiment of the present invention, the 2-state unity gain buffer may have an input terminal and an output terminal, and may include: (i) a differential amplifier having a non-inverting input terminal and an inverting input terminal and an output terminal; (ii) a transistor (e.g., a bipolar transistor) having a first terminal, a second terminal and a control terminal, wherein (a) the first terminal of the transistor is coupled to a power supply voltage reference and (b) the control terminal is coupled to the output terminal of the differential amplifier; and (iii) a diode matrix having a first terminal, a second terminal and a third terminal, wherein (a) the first terminal of the diode matrix is coupled to the inverting input terminal of the differential amplifier, (b) the second terminal of the diode matrix is coupled to the second terminal of the transistor and (c) the third terminal of the diode matrix is coupled to output terminal of the 2-state unity gain buffer. The 2-state unity gain buffer may be configured such that (a) when the 2-state unity gain buffer is in a first state, the voltage across the first and the second terminals of the diode matrix is substantially the voltage drop across a conducting diode, and (b) when the 2-state unity gain buffer is in a second state, the first and the second terminals of the diode matrix are substantially equal.

According to one embodiment of the present invention, a first current source is coupled between the power supply voltage reference and the first terminal of the diode matrix, a second current source is coupled between the second terminal of the transistor and a ground reference, and a third current source is coupled between the ground voltage reference and the third terminal of the diode matrix.

According to one embodiment of the present invention, a voltage-mode maximum voltage follower circuit may be formed by connecting multiple 2-state unity gain buffers of the present invention to a common output terminal of the voltage-mode maximum voltage follower circuit.

The present invention is better understood upon consideration of the detailed description below in conjunction with the accompanying drawings.

BRIEF DESCRIPTION OF THE DRAWINGS

To simplify the detailed description and to facilitate cross-reference among the figures, like elements in the figures are assigned like reference numerals.

DETAILED DESCRIPTION OF THE PREFERRED EMBODIMENTS

The present invention provides a TIA with a single-ended output signal driven by a unity gain buffer with two states that can be combined with the output signals of other such TIAs at a common output terminal without additional components. Such TIAs may be used to construct multiplexed TIAs suitable for use in multi-channel LIDAR receivers.

Figure 1A:
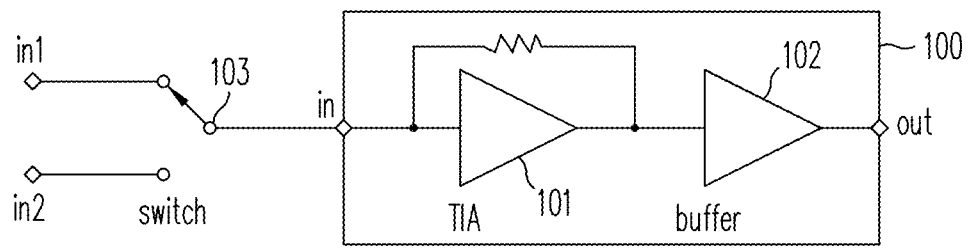
FIG. 1(a) shows conventional TIA 100, which consists of a preamplifier 101 and single-ended output buffer 102, receiving an input signal through a 2:1 selector or multiplexer 103.
Figure 1B:
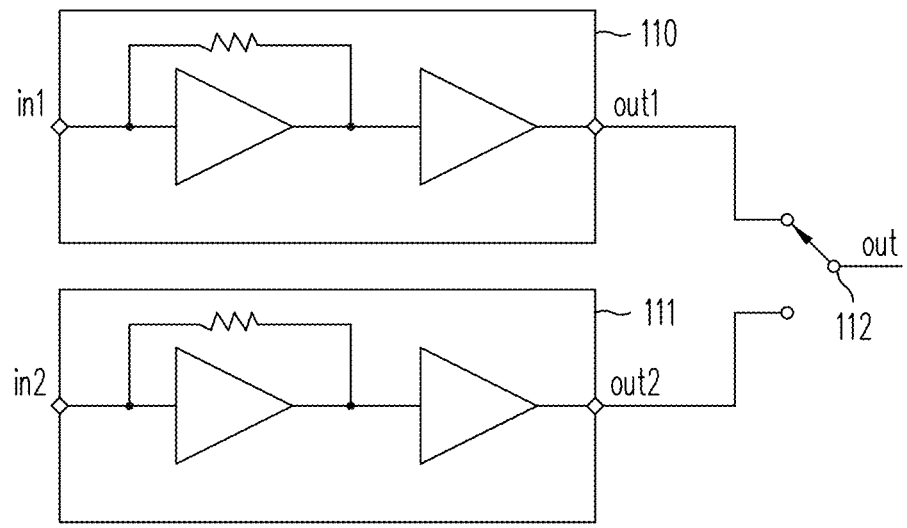
FIG. 1(b) shows switch 112 multiplexing the output signals of conventional TIAs 110 and 111.
Figure 3B:
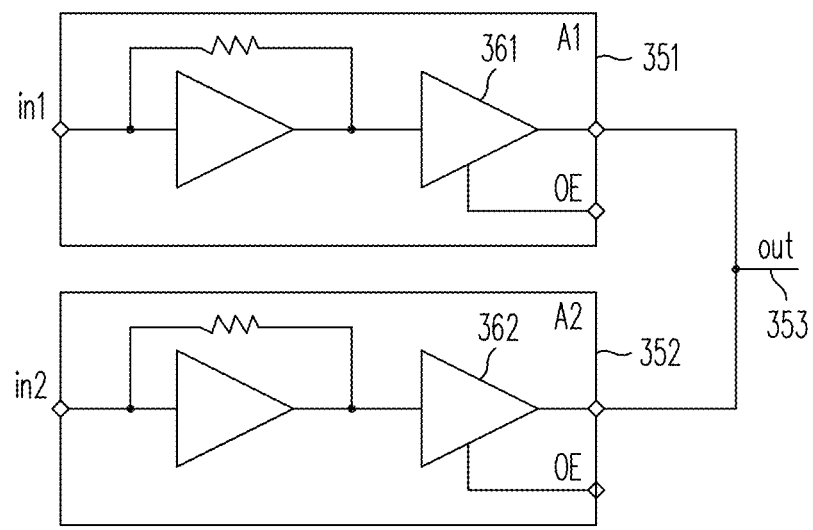
FIG. 3(b) is a block diagram showing TIAs 351 and 352 sharing output terminal 353, in accordance with one embodiment of the present invention.
Figure 2A:
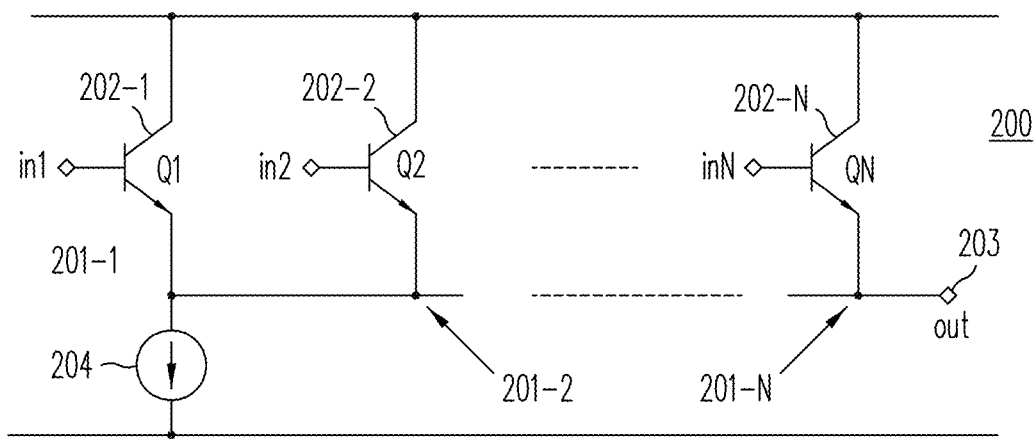
FIG. 2(a) shows conventional voltage-mode maximum follower circuit 200.
Figure 2B:
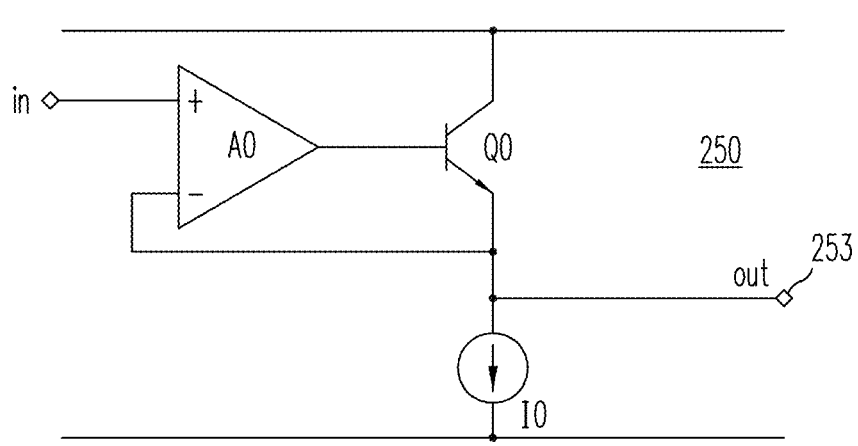
FIG. 2(b) shows conventional unity gain buffer 250.
Figure 3A:
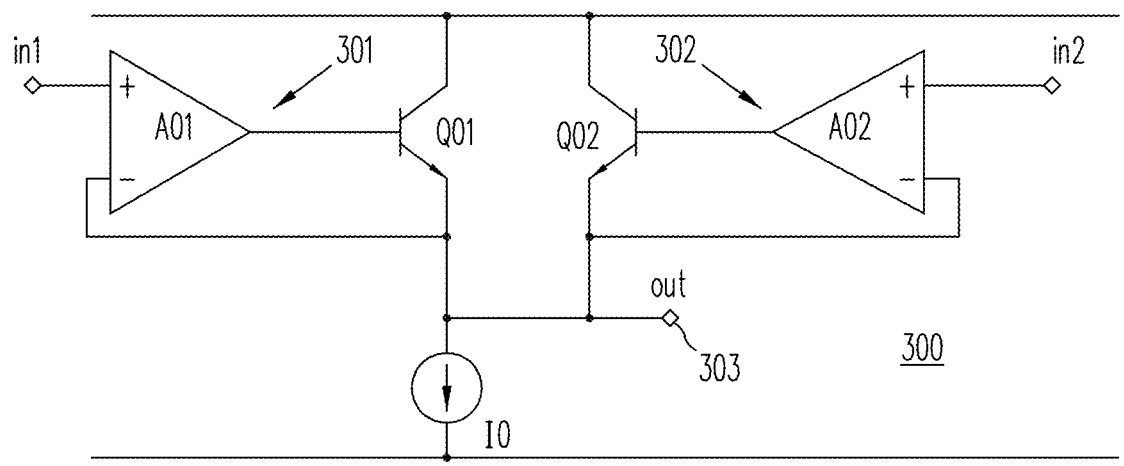
FIG. 3(a) illustrates one unsuccessful attempt to build a voltage-mode maximum follower 300 using unity gain buffers 301 and 302 sharing output node 303.

FIG. 3(b) is a block diagram showing TIAs 351 and 352 sharing output terminal 353, in accordance with one embodiment of the present invention. In FIG. 3(b), when unity gain buffer 361 of TIA 351 is enabled, the input signal at terminal in1 is coupled to output terminal 353, while the unity gain buffer 362 of TIA 352 is disabled, so that the input signal at terminal in2 is isolated from common output terminal 353. Unity gain buffers 361 and 362 of the present invention, unlike prior art unity gain buffers, each operate in one of two states at any given time. In one state, the unity gain buffer provides an output signal at common node 353. In the other state, the unity gain buffer is in a substantially high-impedance state.

The 2-state unity gain buffer of the present invention includes current steering diodes that offer better isolation and faster switching speeds than can be provided by additional switches in the signal paths. N instances of the TIAs of the present invention may be combined to form an N:1 multiplexer without additional components in the signal path, while maintaining low-noise and high bandwidth. Using the TIAs of the present invention, a multi-channel LIDAR receiver can address board, power, and cost constraints. The TIAs of the present invention in such a multi-channel LIDAR receiver may be provided on separate integrated circuits or on the same integrated circuit. Integrating multiple TIAs of the present invention in a multi-channel LIDAR receiver achieves low per-channel power and provides programmable or variable gains to optimize the dynamic range.

Figure 4:
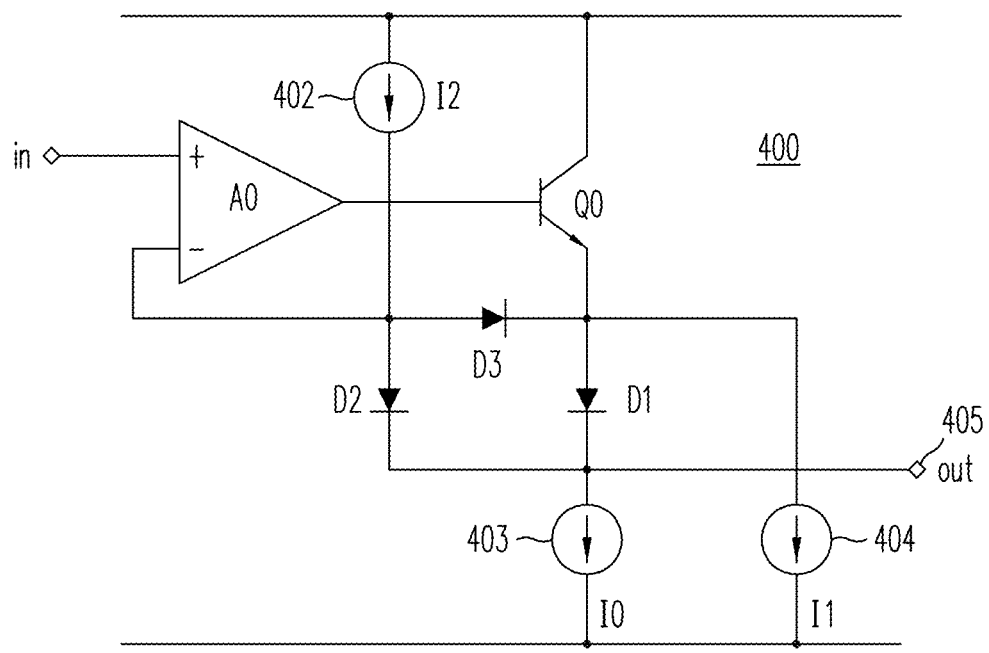
FIG. 4 shows 2-state unity gain buffer 400 which can be used to construct a voltage-mode maximum follower circuit or an output multiplexer circuit, according to one embodiment of the present invention.

FIG. 4 shows 2-state unity gain buffer 400 which can be used to construct a voltage-mode maximum follower circuit or an output multiplexer circuit, according to one embodiment of the present invention. As shown in FIG. 4, 2-state unity gain buffer 400 includes differential amplifier A0, bipolar transistor Q0, diodes $D_1$, $D_2$ and $D_3$, forming a diode matrix, and current sources 402, 403 and 404, providing currents $I_2$, $I_0$ and $I_1$, respectively. 2-state unity gain buffer 400 operates in two distinct states: "ON" and "OFF".

Figure 5:
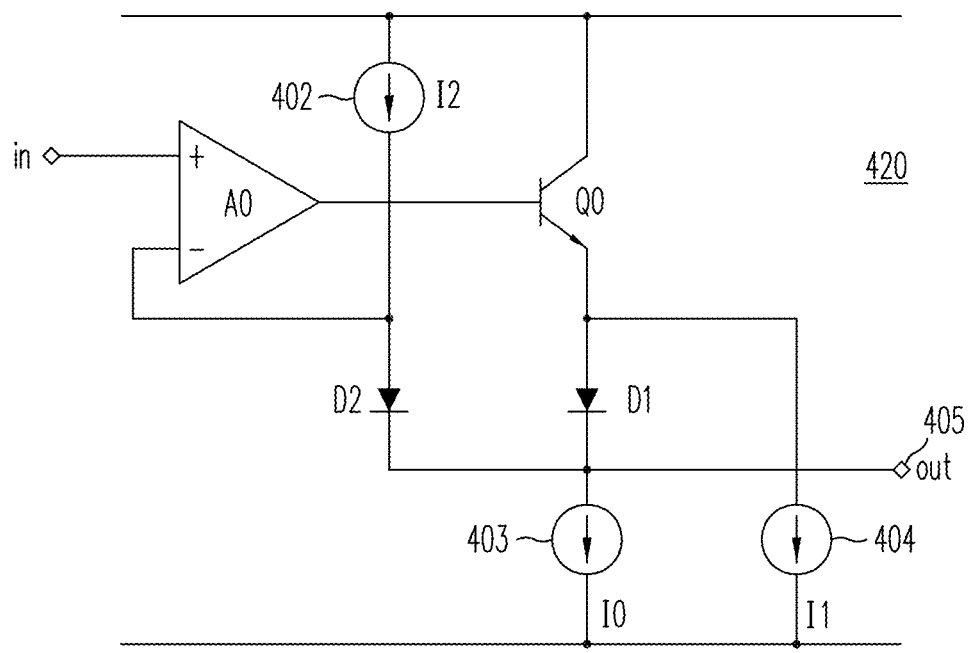
FIG. 5 shows equivalent circuit 420 for 2-state unity gain buffer 400 operating in the ON state, in accordance with one embodiment of the present invention.

In the "ON" state, diode $D_3$ is not conducting, such that the inverting input terminal of differential amplifier A0 and the emitter terminal of transistor Q0 are both coupled by diodes D2 and D1 to output terminal 405. FIG. 5 shows equivalent circuit 420 for unity gain buffer 400 operating in the ON state, in accordance with one embodiment of the present invention. In this configuration, the currents flowing out of the emitter terminal of transistor Q0 and the currents in diodes $D_1$ and $D_2$ are $I_0+I_1-I_2$ and $I_2$, respectively. In this configuration, the inverting terminal of differential amplifier A0 and the emitter terminal of transistor Q0 are substantially equal.

Figure 6:
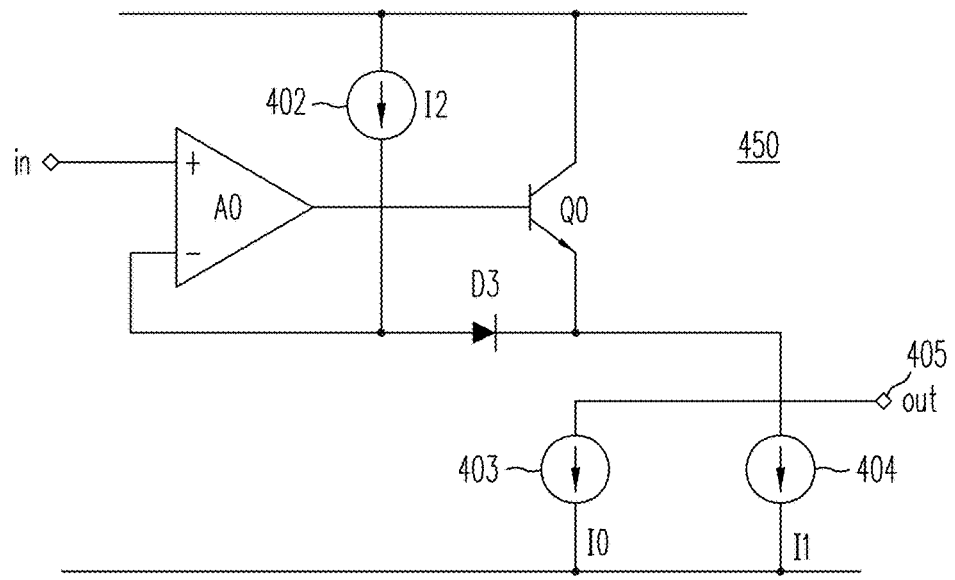
FIG. 6 shows equivalent circuit 450 for 2-state unity gain buffer 400 operating in the OFF state, in accordance with one embodiment of the present invention.

In the OFF state, however, diode $D_3$ is conducting, steering the currents in current source 402 and transistor Q0 away from output terminal 405. FIG. 6 shows equivalent circuit 450 for 2-state unity gain buffer 400 operating in the OFF state, in accordance with one embodiment of the present invention. In this configuration, the current flowing out of bipolar transistor Q0 and the current in diode D3 are $I_1-I_2$ and $I_2$, respectively.

| STATE | Q0 | $D_1$ | $D_2$ | $D_3$ |
|---|---|---|---|---|
| ON | $I_0 + I_1 - I_2$, | $I_0 - I_2$ | $I_2$ | 0 |
| OFF | $I_1 - I_2$ | 0 | 0 | $I_2$ |

Figure 7B:
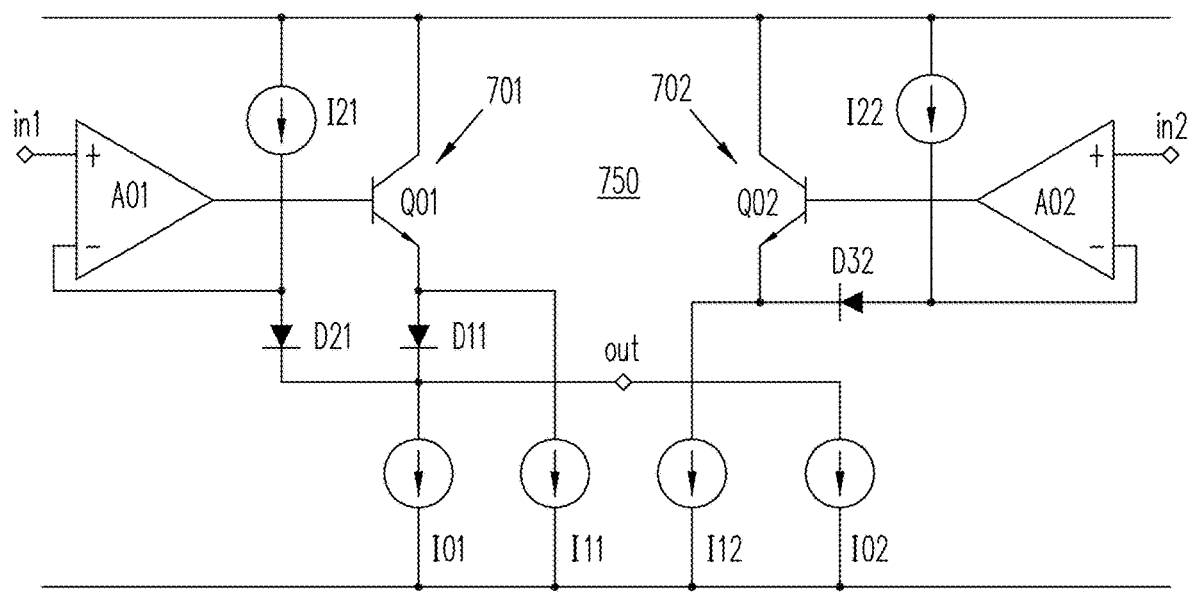
FIG. 7(b) shows equivalent circuit 750 of voltage-maximum follower circuit 700 when 2-state unity gain buffer 701 is in the ON state, and 2-state unity gain buffer 702 is in the OFF state, in accordance with one embodiment of the present invention.
Figure 7A:
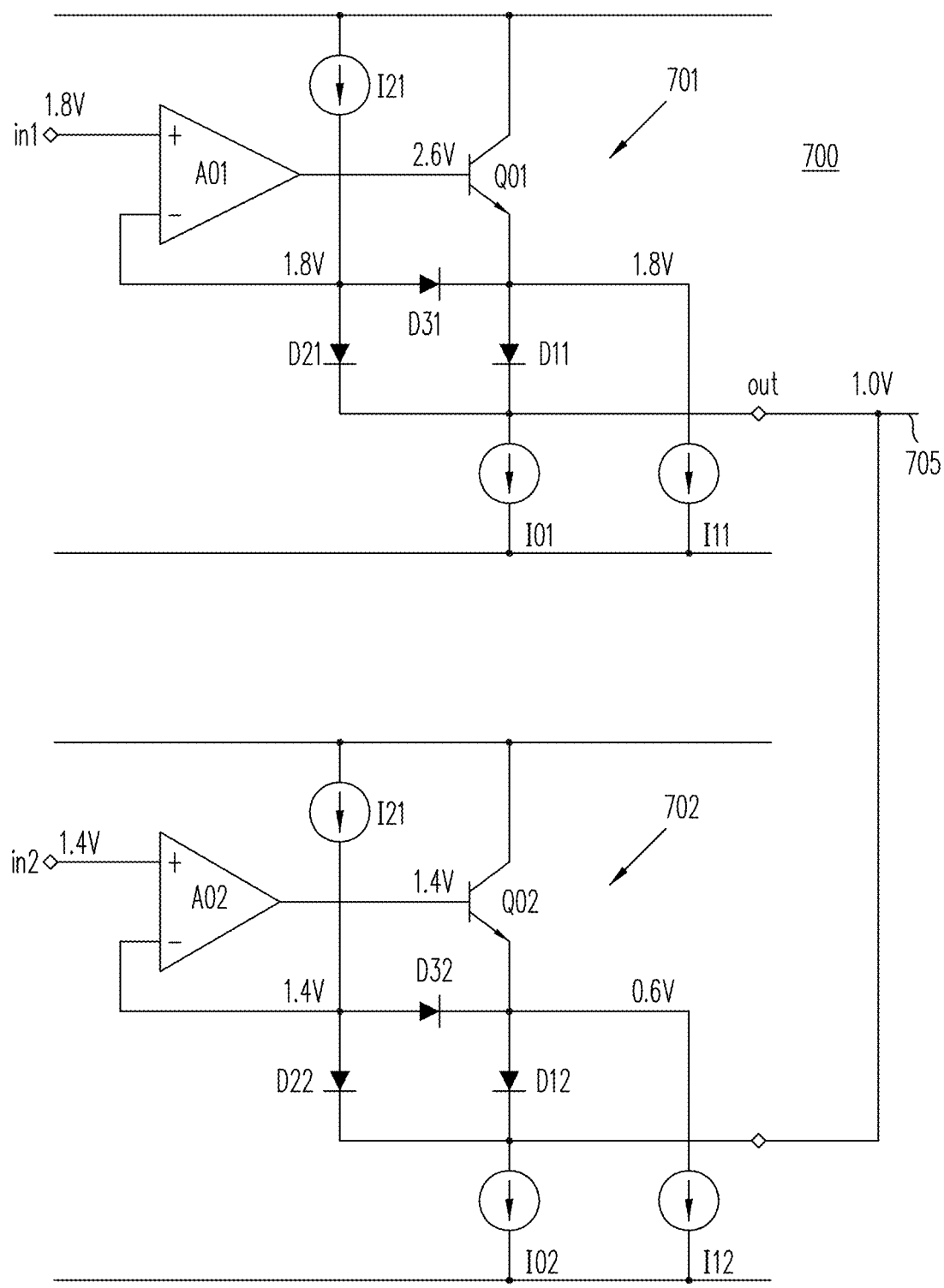
FIG. 7(a) shows voltage-maximum follower circuit 700 that includes 2-state unity gain buffers 701 and 702, in accordance with one embodiment of the present invention.

FIG. 7(a) shows voltage-maximum follower circuit 700 that includes 2-state unity gain buffers 701 and 702, in accordance with one embodiment of the present invention. As shown in FIG. 7(a), the output terminals of 2-state unity gain buffers 701 and 702 are connected at common node 705. FIG. 7(a) also shows exemplary input voltages 1.8 volts and 1.4 volts being applied to 2-state unity gain buffers 701 and 702, respectively. Assuming that the voltage drop across a conducting diode to be approximately, 0.8 volts, exemplary voltages are also labeled in FIG. 7(a) for the base terminals of bipolar transistors Q01 and Q02 and at the input and output terminals of diodes $D_{11}$, $D_{21}$ and $D_{31}$ and $D_{12}$, $D_{22}$ and $D_{32}$ in the respective 2-state unity gain buffers 701 and 702. Thus, FIG. 7(a) shows that 2-state unity gain buffer 701 is in the ON state and 2-state unity gain buffer 702 is in the OFF state. In each 2-state unity gain buffer, the respective differential amplifiers A01 and A02 remain coupled to their respective bipolar transistors Q01 and Q02, such that the voltages at the respective emitter output terminals follow their respective input voltages rapidly, thereby allowing fast transitions in each 2-state unity gain buffer between the ON and the OFF states. To minimize the offset across the input and output terminals in a 2-state unity gain buffer in the ON state, the current sources in the 2-state unity gain buffer may be programmed to maintain the same current density in the emitter current of the bipolar transistor.

FIG. 7(b) shows equivalent circuit 750 of voltage-maximum follower circuit 700 when 2-state unity gain buffer 701 is in the ON state, and 2-state unity gain buffer 702 is in the OFF state, in accordance with one embodiment of the present invention.

Although demonstrated only for two 2-state unity gain buffers in FIG. 7(a), a voltage-mode maximum voltage follower circuit of the present invention may include any number of 2-state unity gain buffers, with their respective diode matrices sharing a common output terminal, while maintaining a maximum frequency response.

Thus, the present invention enables a low-cost LIDAR system, as the 2-state unity gain buffer makes possible tying together the output terminals of multiple channels without using additional switches in the signal path and without compromising the performance (e.g., bandwidth performance) achieved in the TIAs that provide the input signals to the 2-state unity gain buffers.

The above detailed description is provided to illustrate specific embodiments of the present invention and is not intended to be limiting. Numerous variations and modifications within the scope of the present invention are possible. The present invention is set forth in the accompanying claims.

I claim:

1. A multi-channel system having a plurality of signal channels, an individual signal channel configured to receive an input signal from a corresponding light sensor and comprising:
    a pre-amplifier, configured to receive the input signal and provide an amplified signal; and
    a buffer arrangement, configured to receive the amplified signal from the pre-amplifier and provide an output signal at an output terminal of the buffer arrangement, where the output terminals of the plurality of signal channels are coupled to a single output node.

2. The multi-channel system according to claim 1, wherein the buffer arrangement comprises:
    a differential amplifier having a non-inverting input terminal, an inverting input terminal, and an output terminal;
    a transistor having a first terminal, a second terminal and a third terminal, wherein the first terminal of the transistor is coupled to a power supply voltage reference and the third terminal is coupled to the output terminal of the differential amplifier; and
    a diode matrix having a first terminal, a second terminal, and a third terminal, wherein the first terminal of the diode matrix is coupled to the inverting input terminal of the differential amplifier, the second terminal of the diode matrix is coupled to the second terminal of the transistor, and the third terminal of the diode matrix is coupled to the output terminal of the buffer arrangement.

3. The multi-channel system according to claim 2, wherein the buffer arrangement is configured such that (a) when the buffer arrangement is in a first state, the first and the second terminals of the diode matrix have a voltage difference that substantially equals a voltage drop across a conducting diode, and (b) when the buffer arrangement is in a second state, the first and the second terminals of the diode matrix have substantially the same voltage.

4. The multi-channel system according to claim 2, wherein the buffer arrangement further includes a diode, coupled between the first and second terminals of the diode matrix.

5. The multi-channel system according to claim 2, wherein the buffer arrangement further includes:
    a first diode, coupled between the third and first terminals of the diode matrix, and
    a second diode, couple between the third and second terminals of the diode matrix.

6. The multi-channel system according to claim 2, wherein, the buffer arrangement further includes a current source, coupled between the power supply voltage reference and the first terminal of the diode matrix.

7. The multi-channel system according to claim 2, wherein the buffer arrangement further includes a current source, coupled between the second terminal of the transistor and a ground reference.

8. The multi-channel system of claim 2, wherein the buffer arrangement further includes a current source, coupled between a ground voltage reference and the third terminal of the diode matrix.

9. The multi-channel system according to claim 2, wherein the transistor is a bipolar transistor.

10. The multi-channel system according to claim 1, wherein the output terminals of the plurality of signal channels are coupled to the single output node such that the buffer arrangement forms a voltage follower circuit.

11. The multi-channel system according to claim 1, wherein the buffer arrangement includes a plurality of diodes, and wherein configuring the plurality of diodes according to a first set of parameters configures the buffer arrangement to operate in a first state, and configuring the plurality of diodes according to a second set of parameters configures the buffer arrangement to operate in a second state.

12. The multi-channel system according to claim 11, wherein, during operation of the multi-channel system, when the buffer arrangement of one of the plurality of signal channels operates in the first state, the buffer arrangement of each of remaining ones of the plurality of signal channels operate in the second state.

13. The multi-channel system according to claim 1, where the multi-channel system is a multi-channel light detection and ranging (LIDAR) system.

14. The multi-channel system according to claim 13, further comprising a plurality of light sensors, where the individual light signal channel is configured to receive the input signal from a different one of the plurality of light sensors.

15. The multi-channel system according to claim 14, wherein the light sensors include avalanche photodiodes.

16. A system, comprising a buffer arrangement, the buffer arrangement comprising:
   a differential amplifier having a non-inverting input terminal, an inverting input terminal, and an output terminal;
   a transistor having a first terminal, a second terminal, and a third terminal, the first terminal of the transistor is coupled to a power supply voltage reference and the third terminal is coupled to the output terminal of the differential amplifier; and
   a diode matrix having a first terminal, a second terminal and a third terminal, wherein the first terminal of the diode matrix is coupled to the inverting input terminal of the differential amplifier, the second terminal of the diode matrix is coupled to the second terminal of the transistor, and the third terminal of the diode matrix is coupled to output terminal of the buffer arrangement.

17. The system according to claim 16, wherein the buffer arrangement is configured such that (a) when the buffer arrangement is in a first state, the first and the second terminals of the diode matrix have a voltage difference that substantially equals a voltage drop across a conducting diode, and (b) when the buffer arrangement is in a second state, the first and the second terminals of the diode matrix have substantially the same voltage.

18. The system according to claim 16, wherein the buffer arrangement further includes a diode, configured to connect the first and second terminals of the diode matrix.

19. The system according to claim 16, wherein the buffer arrangement further includes:
   a first diode, configured to connect the third terminal of the diode matrix to the first terminal of the diode matrix, and
   a second diode, configured to connect the third terminal of the diode matric to the second terminal of diode matrix.

20. The system according to claim 16, further comprising a current source, coupled to the first terminal of the diode matrix.

21. The system according to claim 16, further comprising a current source, coupled to the second terminal of the transistor.

22. The system according to claim 16, further comprising a current source, coupled to third terminal of the diode matrix.

23. The system according to claim 16, wherein the transistor is a bipolar transistor.

24. The system according to claim 16, where the system is a multi-channel light detection and ranging (LIDAR) system.

25. The system according to claim 24, further comprising a light sensor, coupled to the buffer arrangement to provide a signal generated by the light sensor to the buffer arrangement.

26. The system according to claim 25, wherein the light sensor is an avalanche photodiode.

* * * * *